United States Patent [19]

Leonard et al.

[11] Patent Number: 4,879,512

[45] Date of Patent: Nov. 7, 1989

[54] CIRCUIT FOR PROCESSING A PSEUDO-OSCILLATORY SIGNAL, ESPECIALLY FOR INDUCTIVE PROXIMITY DETECTORS

[75] Inventors: Didier Leonard, Hiersac; Jean-Marie Periot, La Couronne; Pierre Petit, Champniers, all of France

[73] Assignee: La Telemecanique Electrique, France

[21] Appl. No.: 184,852

[22] Filed: Apr. 22, 1988

[30] Foreign Application Priority Data

Apr. 23, 1987 [FR] France ................................ 87 05960

[51] Int. Cl.$^4$ ........................... G01B 7/14; G01D 5/20
[52] U.S. Cl. .................................... 324/207; 324/236; 331/65
[58] Field of Search ................. 324/61 QS, 51 Q, 207, 324/208, 236, 327; 361/179, 180; 331/65; 307/116

[56] References Cited

U.S. PATENT DOCUMENTS

| | | | |
|---|---|---|---|
| 4,068,189 | 1/1978 | Wilson | 324/236 X |
| 4,384,251 | 5/1983 | Schelling et al. | 324/207 |
| 4,446,427 | 5/1984 | Lovrenich | 324/236 X |
| 4,649,341 | 3/1987 | Ulbrich et al. | 324/207 |

FOREIGN PATENT DOCUMENTS 2604251A 3/1988 France .............................. 324/207

Primary Examiner—Gerard R. Strecker
Attorney, Agent, or Firm—William A. Drucker

[57] ABSTRACT

A circuit is provided for processing a pseudo-oscillatory signal generated by an oscillating circuit including a comparator and a logic circuit. The oscillating circuit has a first terminal connected to an energy source by a first switch and a second terminal referenced alternately to a potential substantially equal to half the high potential of the power supply and to the low potential of the power supply. This alternate reference is determined by a second switch controlled synchronously with the first switch by the logic circuit.

5 Claims, 2 Drawing Sheets

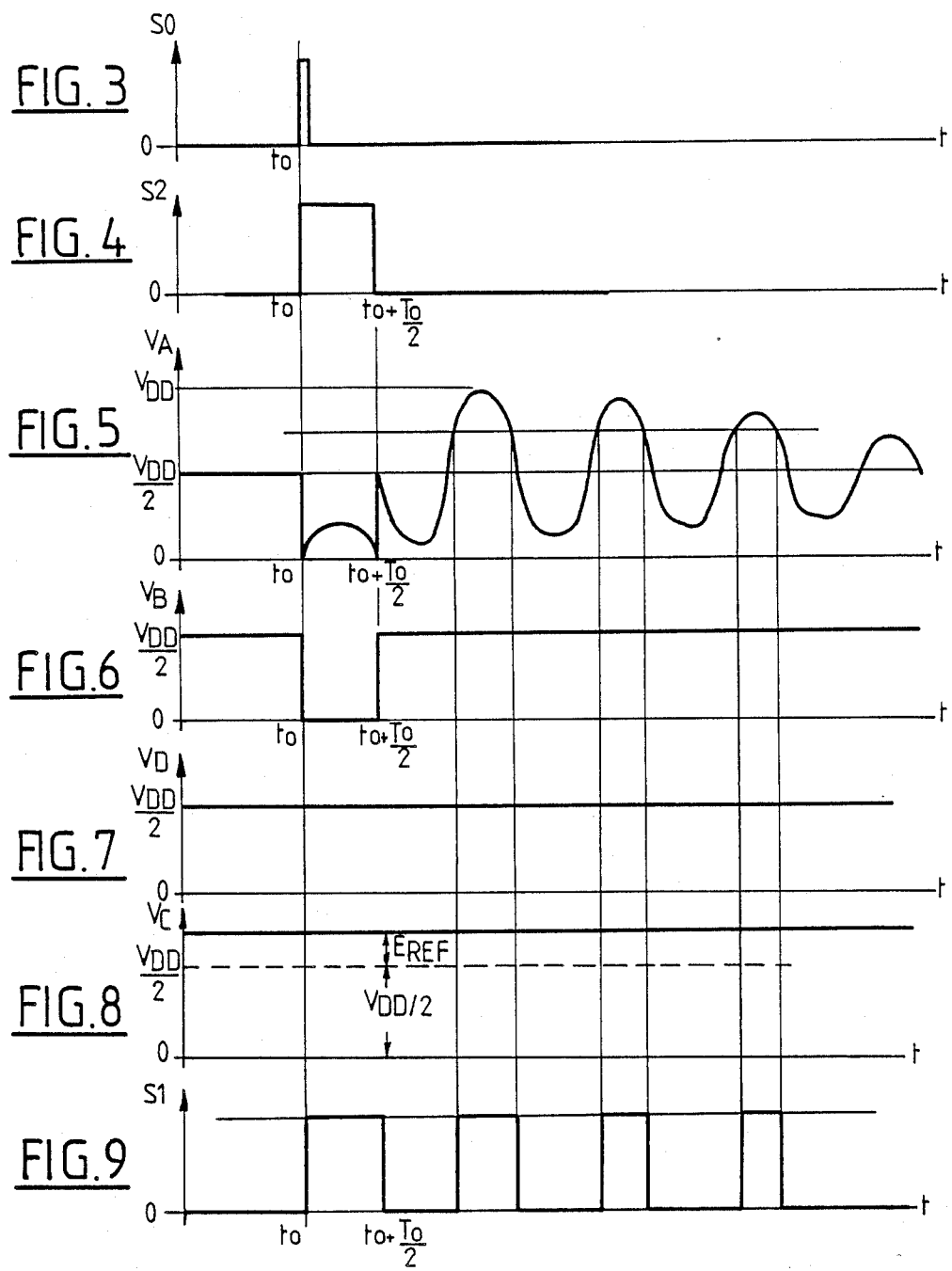

CIRCUIT FOR PROCESSING A PSEUDO-OSCILLATORY SIGNAL, ESPECIALLY FOR INDUCTIVE PROXIMITY DETECTORS

BACKGROUND OF THE INVENTION

1. Field of the Invention

The present invention relates to a circuit for processing a pseudo-oscillatory signal generated by an oscillating circuit, more particularly for an inductive proximity detector or similar apparatus.

2. Description of the Prior Art

A resonating circuit proximity detector is described in the French patent application FR 86 13359 filed on 19th Sept. 1986. The resonating circuit includes a capacitor in parallel with a coil which can be influenced by an object to be detected and it is connected to a power supply through a controllable switch which is driven by control pulses generated by a processing circuit.

Depending on the state of the control pulses, the switch is closed or open and the resonating circuit is charged by a power supply or is respectively discharged with variable damping depending on the object detected.

The processing circuit includes a comparator and a logic circuit. The comparator compares the relaxation voltage of the resonating circuit with a threshold so as to generate measurement pulses representative of the presence and of the distance of an electrically conducting object; the measurement pulses are transmitted to the logic circuit which delivers a measurement signal to a user circuit having a digital input and controls the closure and opening cycles of the static switch.

The proximity detector described has the advantage of allowing even very close objects to be detected while facilitating direct digital processing of the analog proximity information.

It seems desirable to construct the processing circuit of such a proximity detector—or of any other similar apparatus using an influenceable resonating circuit—in the form of an integrated circuit adapted to MOS technology and to reduce the consumption of this circuit.

In addition, in such a circuit, it would be advantageous to minimize or suppress the adjustments and to provide self compensation of the temperature and voltage supply drifts.

The purpose of the invention is to respond to these requirements in a processing circuit of the above described type.

SUMMARY OF THE INVENTION

In accordance with the invention, the processing circuit is such that the oscillating circuit is connected to the high potential of the power supply and is alternately referenced to a potential substantially equal to half this high potential of the power supply and to the low potential of the power supply, this alternate connection being determined by a second switch controllable synchronously with the first switch.

BRIEF DESCRIPTION OF THE DRAWINGS

Embodiments of the invention will be described hereafter, by way of non limitative examples, with reference to the accompanying drawings in which:

FIGS. 3 to 9 show different characteristic signals of the circuit.

DESCRIPTION OF THE PREFERRED EMBODIMENTS

Figure 1:
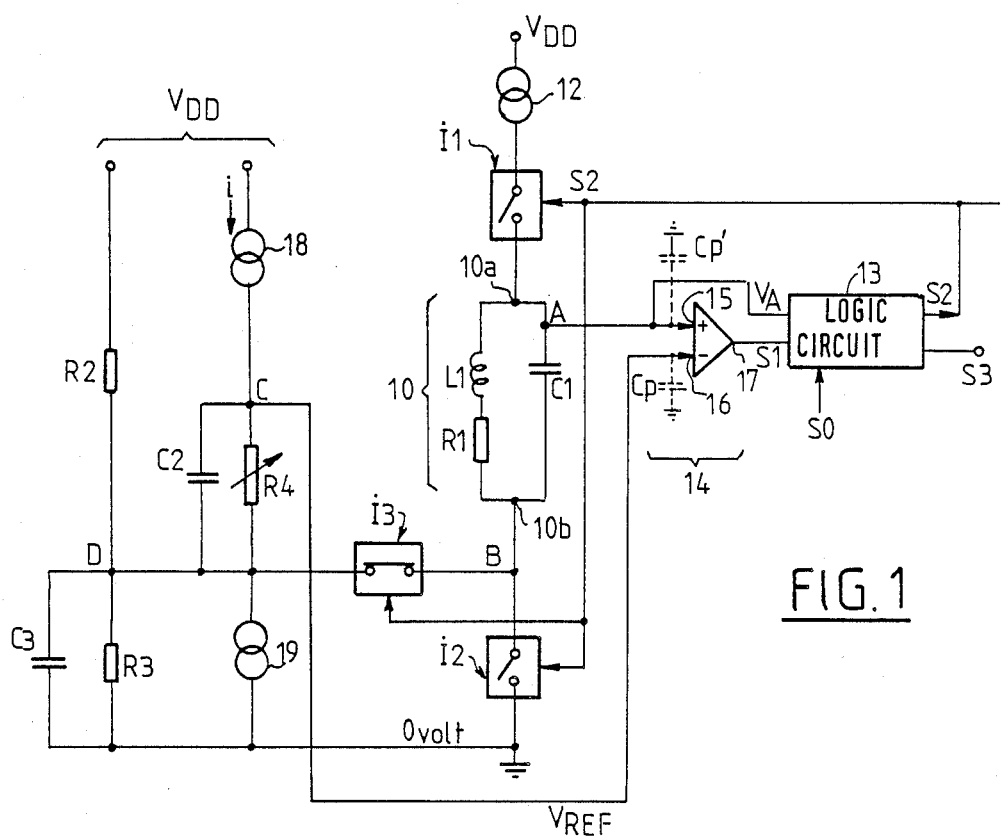
FIG. 1 shows a processing circuit in accordance with the invention.

The inductive proximity detector shown in the drawings includes an oscillating or resonating circuit 10 which comprises an inductance coil L1 in parallel with a capacitor of capacity C1. A low resistance R1 in series with coil L1 is representative of the losses.

With the coil being influenceable by the proximity of electrically conducting objects, the result is that the damping of the oscillating circuit varies as a function of this proximity.

A first terminal 10a of the oscillating circuit 10 is connected via a series switch I1, to a constant current source 12 to which the high potential $V_{DD}$ of the power supply is supplied. To a second terminal 10b of the oscillating circuit, either a voltage $V_{DD/2}$ or the low potential—here zero volt—of the power supply is applied by means which will be described further on.

A hot point A of the oscillating circuit is connected both to an input of a logic circuit 13 and to a signal input 15 of a comparator 14. The comparator has a threshold input 16 connected to a point C brought to a threshold potential $V_{REF}$ equal to $V_{DD/2} + E_{REF}$. The output 17 of the comparator is connected to an input of the logic circuit 13 so as to apply to the latter square waves signals S1 whose width corresponds to the overshoot of the threshold potential $V_{REF}$ by the voltage $V_A$ of the oscillating circuit. The logic circuit 13 furthermore receives pulses SO each of which initializes a charge-discharge cycle of the oscillating circuit 10.

The logic circuit 13 includes logic means and counting and enabling means for generating, at an output connected to the control electrode of switch I1, square wave signals S2 for controlling the cycles for closing and opening I1, and at an output connectable to a user circuit having a digital input, a signal S3 representative of the presence and of the distance of an electrically conducting object.

A reference or cold point B of the oscillating circuit is connected to the middle point D of a divider bridge formed of two resistors R2, R3 of the same high value and to the low or reference potential of the power supply by a controllable switch I2. The resistors R2 and R3 are connected respectively to the high potential $V_{DD}$ and to the low potential of the power supply. It will be readily understood that the points B and D are thus referenced to $V_{DD/2}$, for following the variations of the power supply voltage. Switch I2 is controlled synchronously with switch I1 by the signals S2 generated by the logic circuit 13. Point B is therefore referenced to $V_{DD/2}$, except during the brief pulse for charging the oscillating circuit, by use of a low consumption resistance bridge R2, R3.

In the processing circuit of the invention, the reference voltage $V_{REF}$ is provided without needing a second resistance bridge. For this, the point C of the processing circuit is connected both to the potential $V_{DD}$ via a first current source 18 and to point D via an adjustable resistor R4 itself connected to the low potential through a second current source 19 extracting the same current as that injected by source 18. Thus, point B remains at potential $V_{DD/2}$ since the current i which flows through resistor R4 does not flow through resistors R2, R3. The current sources 18, 19 may in addition be formed by transistors controlled by the same base current. The adjustment of R4 makes it possible to adjust the threshold of comparator 14.

Advantageously, the current sources 12, 18, 19 may be readily formed so as to vary identically depending on the temperature and on the power supply voltage $V_{DD}$.

Point C is connected to point D through a capacitor C2 connected in parallel across the threshold resistor R4; point D is connected to the low potential by a capacitor C3 connected in parallel across resistor R3 and the current source 19. Capacitors C2, C3 are chosen with a value higher than the parasite input capacities $C_p$, $C_p$ of comparator 14. These capacitors C2, C3 provide alternate decoupling of the voltage reference points C and D and thus prevent the voltage at point A from becoming negative when the potential at point B passes from zero to $V_{DD/2}$, and the parasite capacities from undesirably damping the resonating circuit.

A third controllable switch I3 whose state is complementary to that of I1, I2 is provided in the connection between points B and D for preventing the decoupling capacitors C2, C3 from discharging towards the low point of the power supply when switch I2 is closed. Switches I1, I2, I3 are controlled synchronously by pulses S2.

Figure 2:
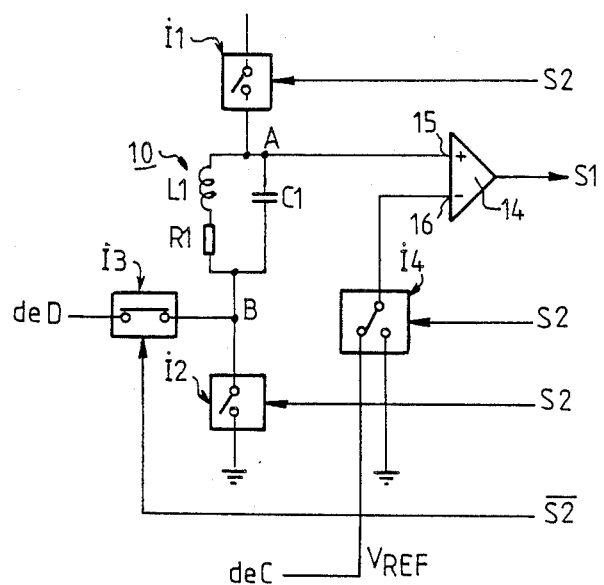
FIG. 2 shows a variant of part of the circuit of FIG. 1.

In the variant illustrated in FIG. 2, an inverter I4 controllable synchronously with I1, I2 and I3 is disposed between the theshold input 16 of comparator 14 and, depending on the state of the inverter, point C or the low potential point of the power supply. This makes it possible, during charging of the oscillating circuit, to compare the voltage at point A with the low point of the power supply so that the output of the comparator changes state when $V_A$ passes to zero. The logic circuit 13 is adapted so as then to cause the control pulse S2 to cease, so that the charge of the oscillating circuit is automatically adjusted.

It will be noted that the oscillating circuit 10 shown here in the form of a parallel resonating circuit fed by a constant current source, may in a variant be a series resonating circuit fed by a constant voltage source. In this case, the hot point A of the circuit connected to input 15 of the comparator is the intermediate point between inductor L and capacitor C of the oscillating circuit. Detection of the zero cross over of $V_A$ is then replaced by detection of the zero cross over of the current in the oscillating circuit.

The operation of the processing circuit of the invention is explained hereafter with reference to FIGS. 3 to 9. Only a small number of oscillations have been shown for the sake of clarity.

FIG. 3 shows the signal SO emitted in the form of pulses at time $t_o$ for controlling the logic circuit 13, in order to initialize the charge-discharge cycle of the oscillating circuit. The frequency of signal SO is determined for example by an oscillator; in a modification, this signal may be regenerated at the end of each cycle.

FIG. 4 shows signal S2 generated by the logic circuit 13 for controlling switchs I1–I4. At time $t_o$, in response to the initialization pulse SO, the control signal S2 goes high. Consequently, switch I1 is closed so that (see FIG. 5) the oscillating circuit is charged through the constant current source 12. Switch I2 is also closed at time $t_o$ so that the potential at point B (see FIG. 6) passes to zero volt. Switch I3 opens so as to prevent the decoupling capacitors C2, C3 from discharging via I2. Inverter I4 is switched at time $t_o$ to its position providing the connection of the input 16 of the comparator with ground. Thus, the output signal S1 of comparator 14 passes to its high level at time $t_o$. The potential at A evolves as shown in FIG. 5, then repasses to zero at time $t_o + T_o/2$, $T_o$ being the pseudo-oscillation period of the oscillating circuit. The result is that the output signal S1 of the comparator returns to its low level and the logic circuit 13 causes signal S2 to return to the low state. Thus, I1 and I2 open, I3 is closed and I4 provides the connection of the input 16 of the comparator with point C.

Thus, at time $t_o + T_o/2$, the relaxation voltage $V_A$ of the oscillating circuit (FIG. 5) begins to oscillate about $V_{DD/2}$ with the relatively high amplitude permitted by the arrangement of the invention. Whenever the comparator detects that $V_A > V_{REF}$, its output signal S1 is high (see FIG. 9). The logic circuit counts the leading edges of the square waves S1 and generates a corresponding output signal S3 usable by a digital input apparatus.

The processing circuit described lends itself well to integration using MOS technology. It has low consumption and does not require adjustments due for example to changes of the inductance of the detection coil, while compensating for temperature and supply voltage drifts.

What is claimed is:
1. An inductive proximity detector comprising:
  (i) an oscillating circuit having a capacitor and a coil connected together between a hot point terminal and a reference terminal;
  (ii) a power supply source having a hot point terminal at a first potential and a reference terminal at a second potential substantially lower than said first potential, and a first controllable switch connecting said hot point terminal of the source to the hot point terminal of the oscillating circuit, said first switch having a first control input;
  (iii) a comparator comparing the voltage at the hot point terminal of the oscillating circuit with a predetermined reference voltage level for generating at an output thereof output square waves signals indicative of the damping of the oscillating circuit as a function of the distance of an object to be detected;
  (iv) logic circuit means having a first input connected to said hot point terminal, a second input connected to the output of the comparator, a third input receiving periodic pulses for initializing charge-discharge cycles of the oscillating circuit and an output connected to said first control input for applying to said first control input further square wave signals controlling the opening and closing of the first switch;
  (v) a second controllable switch having a second control input connected to the output of the logic circuit means, and
  (vi) further circuit means generating and applying to said reference terminal of the oscillating circuit a further potential substantially equal to half of said first potential when the second switch is open, said second switch connecting the said reference terminal of the oscillating circuit to the power supply reference terminal at said second potential and thus applying said second potential to the reference terminal of the oscillating circuit when the second switch is closed.

2. The inductive proximity detector as claimed in claim 1, wherein:
   (i) said further circuit means include a voltage divider bridge comprising first and second resistors and having a middle point connected to the reference terminal of the oscillating circuit and first and second terminals respectively connected to the hot point terminal and the reference terminal of the power supply source,
   (ii) said comparator has a threshold input connected to a threshold point and a first constant current source connects said threshold point to said hot point terminal of the power supply source, wherein a series circuit comprising a threshold resistance serially connected with a second constant current source, connects said threshold point to said reference terminal of the power supply source.

3. The inductive proximity detector as claimed in claim 2, wherein a parallel circuit comprising a decoupling capacitor in parallel across said threshold resistor further connects said threshold point to said middle point and a further decoupling capacitor in parallel across the second resistor of said divider bridge connects said middle point to the reference terminal of the power supply source.

4. The inductive proximity detector as claimed in claim 3, wherein a third controllable switch connects said middle point to the reference terminal of the oscillating circuit through said third switch having a control input connected to the output of the logic circuit means.

5. The inductive proximity detector as claimed in claim 1, wherein the comparator has a threshold input and a static inverter switch connects said threshold input either to a source of a threshold potential or to the reference terminal of the power supply source, said inverter having a control input connected to the output of said logic circuit means.

* * * * *